(12) United States Patent
Yang et al.

(10) Patent No.: US 11,211,909 B2
(45) Date of Patent: Dec. 28, 2021

(54) ADJUSTABLE CAPACITORS TO IMPROVE LINEARITY OF LOW NOISE AMPLIFIER

(71) Applicant: GLOBALFOUNDRIES U.S. Inc., Malta, NY (US)

(72) Inventors: Qiao Yang, Shanghai (CN); Thomas G. McKay, Boulder Creek, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/889,840

(22) Filed: Jun. 2, 2020

(65) Prior Publication Data
US 2021/0376805 A1 Dec. 2, 2021

(51) Int. Cl.
*H03F 3/45* (2006.01)

(52) U.S. Cl.
CPC ... *H03F 3/45183* (2013.01); *H03F 2200/294* (2013.01); *H03F 2203/45508* (2013.01); *H03F 2203/45544* (2013.01)

(58) Field of Classification Search
CPC .................................................. H03F 3/4518
See application file for complete search history.

(56) References Cited

U.S. PATENT DOCUMENTS

| | | | |
|---|---|---|---|
| 5,673,001 A | 9/1997 | Kim et al. | |
| 6,867,658 B1* | 3/2005 | Sibrai | H03B 5/1215 331/117 FE |
| 8,238,867 B1 | 8/2012 | Khoini-Poorfard | |
| 8,306,494 B2 | 11/2012 | Ojo | |
| 9,413,341 B1* | 8/2016 | Ho | H03B 5/368 |
| 2006/0284670 A1* | 12/2006 | Eid | H03F 3/45183 327/563 |
| 2006/0290427 A1 | 12/2006 | Oh | |
| 2009/0251177 A1* | 10/2009 | Jang | H03B 27/00 327/118 |
| 2011/0267144 A1* | 11/2011 | Behera | H03F 3/3081 330/260 |
| 2012/0019328 A1* | 1/2012 | Shibata | H03B 5/124 331/34 |
| 2015/0295736 A1* | 10/2015 | Bulzacchelli | H04L 25/03057 375/233 |

OTHER PUBLICATIONS

Guo et al., "6.8 mW 15 dBm IIP3 CMOS Common-Gate LNA Employing Post-Linearisation Technique," Electronic Letters, vol. 50, No. 3, 2014, pp. 149-151.

Jussila et al., "A 1.2-V Highly Linear Balanced Noise-Cancelling LNA in 0.13-um CMOS," IEEE Journal of Solid-State Circuits, vol. 43, No. 3, 2008, pp. 579-587.

Rungta et al., "IIP3 Improvement in Subthreshold LNAs using Modified Derivative Superposition Technique for IoT Applications," IEEE Computer Society, 32nd International Conference on VLSI Design and 18th International Conference on embedded Systems (VLSID), 2019, pp. 130-134.

* cited by examiner

*Primary Examiner* — Patricia T Nguyen
(74) *Attorney, Agent, or Firm* — Gibb & Riley, LLC; David A Cain, Esq.

(57) ABSTRACT

An amplifier includes an input transistor pair connected to amplifier input nodes, a complementary transistor pair connected to a common bias, amplifier output nodes connected to the input transistor pair and the complementary transistor pair, and variable capacitors connected between the complementary transistor pair and the amplifier output nodes.

19 Claims, 8 Drawing Sheets

ADJUSTABLE CAPACITORS TO IMPROVE LINEARITY OF LOW NOISE AMPLIFIER

BACKGROUND

Field of the Invention

The present disclosure relates to low noise amplifiers (LNAs), and more specifically, to improving linearity of LNAs.

Description of Related Art

Amplifiers take many forms and serve many functions, such as radio frequency (RF) amplification. For example, amplifiers in transmitter-receivers are used for voice and data communication. RF power amplifiers using LDMOS (laterally diffused MOSFET) are the most widely used power semiconductor devices in wireless telecommunication networks, particularly mobile networks. RF power amplifiers are intended to transmit power at the transmitter side while low noise amplifiers (LNAs) are intended to amplify received signals at the receiver side. Thus gain, noise figures, and linearity are key performance indicators for LNAs. It is desirable for LNAs to faithfully amplify received signals without adding much noise and distortion. Poor linearity will cause unwanted distortion and interference.

A common trade-off in amplifier design is the balance between efficiency and linearity. Specifically, linearity is the behavior of an amplifier, in which the output signal strength varies in direct proportion to the input signal strength. When inputs and outputs are graphed, the gain (amplification factor) determines the slope of the line; however, the straightness (linearity) of the graphed line shows the linearity of the amplifier. Therefore, a steeper slope shows a greater amplifier gain but the straightness (linearity) of the graphed line shows the linearity of the amplifier. Often gains in linearity are at the expense of efficiency of the amplifier.

SUMMARY

Various amplifier structures herein include (among other components) an input transistor pair and a complementary transistor pair. Sources/emitters of the input transistor pair are connected to amplifier input nodes. Further, the gates/bases of the complementary transistor pair are connected to a common bias. Additionally, amplifier output nodes are connected to a drain/collector of the input transistor pair and a source/emitter of the complementary transistor pair.

Also, first capacitors are connected between the gates/bases of the input transistor pair and the amplifier input nodes, second capacitors are connected between the gates/bases of the complementary transistor pair and the amplifier input nodes, and variable capacitors are connected between the gates/bases of the complementary transistor pair and the amplifier output nodes. Further, voltage bias sources are connected to the variable capacitors.

The variable capacitors can be connected within a given side or cross-coupled between (across) the amplifier output nodes. The transistors of the input transistor pair have an opposite polarity from the transistors of the complementary transistor pair. The variable capacitors can be, in one example metal-oxide semiconductor (MOS) capacitors.

In one example, the variable capacitors comprise MOS transistors having back gates connected to the voltage bias sources. The MOS transistors of the variable capacitors have gates/bases connected to the gates/bases of the complementary transistor pair, and have sources and drains connected to the amplifier output nodes. However, in other implementations, the gates/bases of the variable capacitors can be connected to the amplifier output nodes while sources and drains can be connected to the gates/bases of the complementary transistor pair The capacitances of the variable capacitors are controlled by the voltage bias sources.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, a common trade-off in amplifier design is the balance between efficiency and linearity. Low-noise amplifiers (LNAs) can be identified as combinations of 3 topologies: common source (CS), common gate (CG), and common drain (CD). For linearity, only CS and CG may be considered. For a single device, the gate to drain capacitance (Cgd) is a path that can induce nonlinearity. Sometimes, the nonlinear component of the amplifier can be reduced by reducing gate to drain capacitance, while in other cases increasing gate to drain capacitance results in a smaller nonlinear component, depending on the low-noise amplifiers structure.

In view of this, the structures herein use back gate-controlled variable capacitors (e.g., body, bulk, or back gate-controlled variable capacitors, such as metal oxide semiconductor (MOS) capacitors) to adjust the gate to drain capacitance of transistors (e.g., metal oxide semiconductor field effect transistors or MOSFETs) in low-noise amplifiers to improve linearity. These variable capacitors can be used either in cross-coupling or non cross-coupling structures. Integrated circuit capacitors are typically constructed by tying together the source and drain electrodes of an MOS transistor and using this tied junction as the bottom plate node of an equivalent parallel plate capacitor, while the gate is the top plate. These structures adjust the voltage across the bottom and top plates to change the capacitance of the variable capacitor.

Figure 1A:
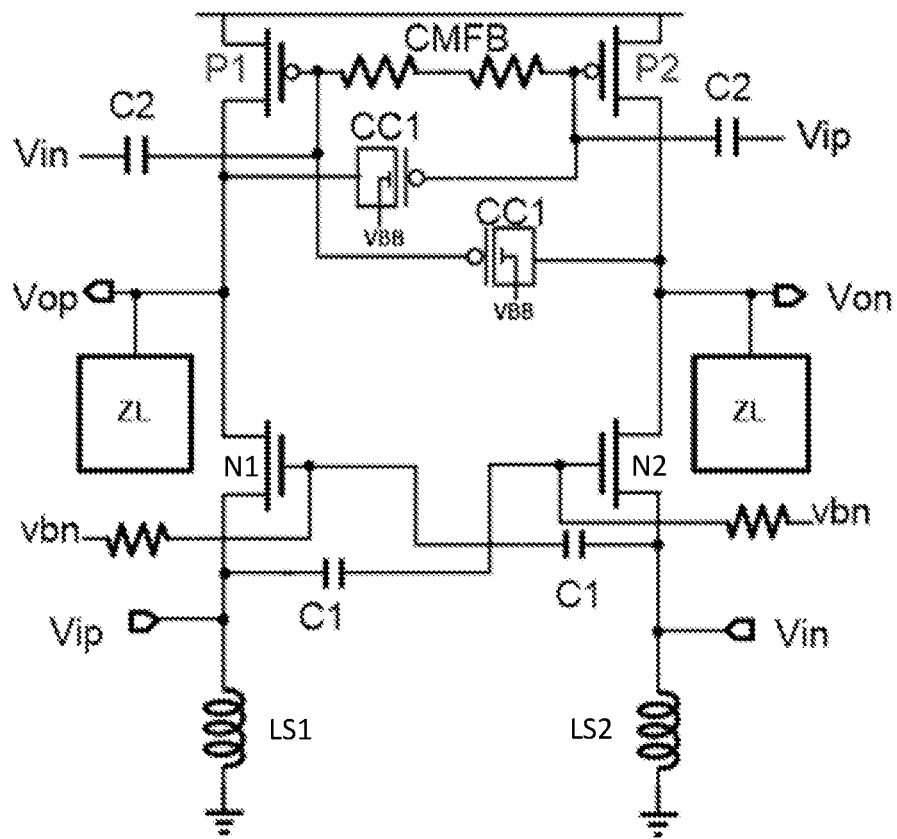
FIGS. 1A-1B are schematic diagrams illustrating a cross coupled amplifier with differential input according to embodiments herein.

As shown for example in FIG. 1A, various amplifier structures herein include (among other components) an input transistor pair N1, N2 and a complementary (opposite polarity doping) transistor pair P1, P2. Sources/emitters of the input transistor pair N1, N2 are connected to amplifier input nodes Vip (first input signal), Vin (second input signal, complementary to Vip). Further, the gates/bases of the complementary transistor pair P1, P2 are connected to a bias, such as a common-mode feedback bias (CMFB).

The transistors are opposite polarity transistors (e.g., P1 and P2 are P-type transistors, and N1, N2 are N-type transistors) and can be bipolar junction transistors (BJT), but are more commonly field effect transistors (FET). Additionally, amplifier output nodes Vop (first output signal), Von (second output signal, complementary to Vop) are connected to a drain/collector of the input transistor pair N1, N2 and a source/emitter of the complementary transistor pair P1, P2.

Input impedances LS1, LS2 (inductors) are connected to the sources/emitters of the input transistor pair N1, N2. Voltage sources vbn are connected to the gates/bases of the input transistor pair N1, N2 to bias the gates. The circuit amplifies the input signals Vip, Vin to produce the amplified output signals on the output nodes Vop, Von. Loads (ZL) are connected to the output nodes Vop, Von.

Also, cross-coupled first capacitors C1 (fixed (not variable) capacitance capacitors) are connected between the gates/bases of the input transistor pair N1, N2 and the amplifier input nodes Vip, Vin. These first capacitors C1 provide input coupling (e.g., to block DC components) for transistors N1, N2. Second capacitors C2 (again fixed capacitance capacitors) are connected between the gates/bases of the complementary transistor pair P1, P2 and the amplifier input nodes Vip, Vin in order to again provide input coupling for transistors P1, P2.

Variable capacitors CC1 are connected between the gates/bases of the complementary transistor pair P1, P2 and the amplifier output nodes Vop, Von to further improve linearity. Further, voltage bias sources VBB are connected to the variable capacitors CC1 to adjust the capacitance of the variable capacitors CC1.

The variable capacitors CC1 can be connected within a given side or cross-coupled between (across) the amplifier output nodes Vop, Von. The transistors of the input transistor pair N1, N2 have an opposite polarity from the transistors of the complementary transistor pair P1, P2.

In one example, the variable capacitors CC1 comprise MOS transistors having back gates connected to the voltage bias sources VBB. The MOS transistors of the variable capacitors CC1 have gates/bases connected to the gates/bases of the complementary transistor pair P1, P2, and have sources and drains connected to the amplifier output nodes Vop, Von. However, in other implementations, the gates/bases of the variable capacitors can be connected to the amplifier output nodes while sources and drains can be connected to the gates/bases of the complementary transistor pair The capacitances of the variable capacitors CC1 are controlled by the voltage bias sources VBB.

In operation, a differential signal is supplied to Vip, Vin to the gates/bases and source/emitters of transistors N1, N2, which are connected to have cross-coupled common source/emitters and non cross-coupled common gates/bases. The fixed capacitance capacitors C1 are connected between the input nodes Vip, Vin and the gates/bases of transistors N1, N2 to provide input coupling. The voltage source vbn is used to bias the gates/bases of transistors N1, N2, to provide a DC bias point for the amplifier. In transistors P1, P2 the CMFB similarly biases the gates/bases of transistors P1, P2, and these gates/bases also receive input Vin, Vip through capacitors C2.

Figure 1B:
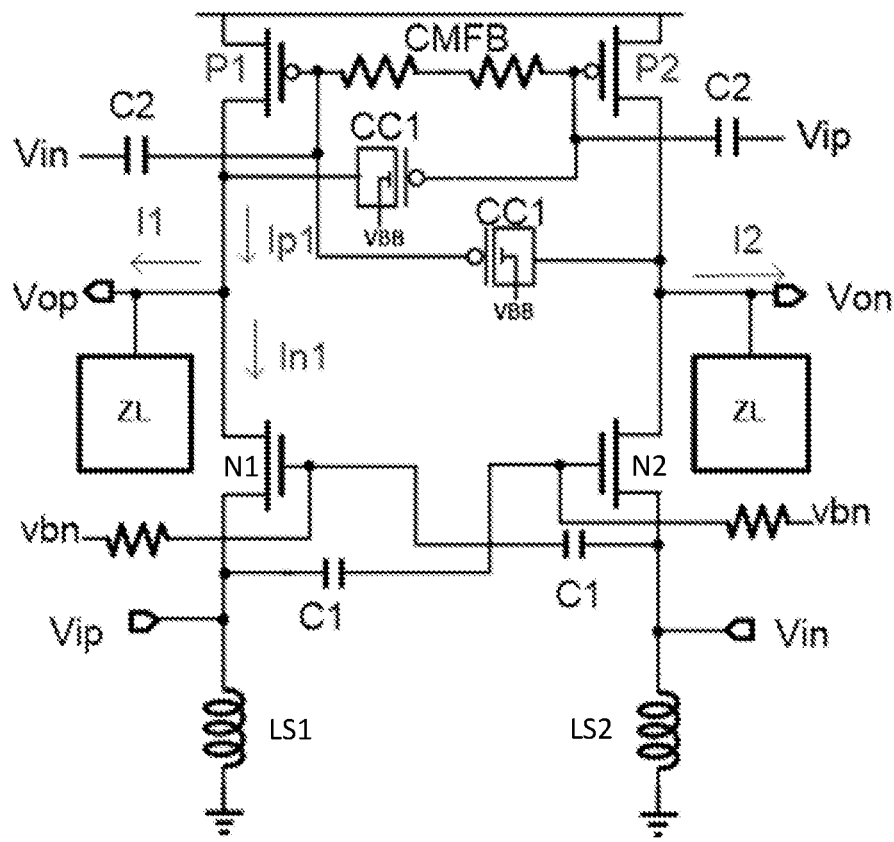

FIG. 1B shows the same devices shown in FIG. 1A with intermodulated current induced by the device's nonlinearity, which is denoted in the drawings by Ip1, Ip2, and I1, I2, where Ip1 is the intermodulated current generated by P1, In1 is the intermodulated (IM) current generated by N1, I1 is the total intermodulated current flowing out of Vop, and I2 is the total intermodulated current flowing out of Von, respectively. The IM (intermodulated) current is not signal current, but is the nonlinear component.

Linearity can be characterized by the total nonlinear current magnitude, i.e. total IM current magnitude Io=|I1+I2|. The smaller the current magnitude Io is with respect to the input fundamental signal, the more linear the amplifier is. When differential inputs are supplied to nodes Vip, Vin, the amplifier is symmetrical looking either from the input or output. Hence, the currents I1 and I2 are the same amount but naturally out of phase, i.e. I1=−I2, which gives a total IM current 2|I1|. In order to improve linearity, |I1|=|Ip1−In1| should be minimized. Note that the relative magnitude and polarities of currents Ip1 and In1 may be uncertain, because this is determined by device bias condition (and can be derived from simulation).

If currents Ip1 and In1 are in phase, and |Ip1|<|In1|, then |I1|=|In1|−|Ip1|. Increasing current Ip1 up to |In1| will reduce |I1|, making current Io smaller and improving linearity. In FIG. 1B, both Vin and Von are coupled to the gate of transistor P1 through capacitors C2 and CC1 respectively. Vin and Von have the same polarity, and thus will generate the same polarity IM current in transistor P1. In other words, Von coupled through variable capacitor CC1 increases current Ip1, which compensates current In1 to get a smaller |I1|, again making current Io smaller and improving linearity. The generated compensating current amount can be adjusted through the voltage bias sources VBB applied to back gate of variable capacitor CC1. If currents Ip1 and In1 are in phase, and |Ip1|>|In1|, then |I1|=|Ip1|−|In1|. Alternatively, if currents Ip1 and In1 are out of phase, then |I1|=|Ip1|+|In1|. Both conditions require less |Ip1| to reduce |I1| when improving linearity (and again, reducing |I1| makes current Io smaller and improves linearity) which shows how the non cross-coupled variable capacitors CC2 in FIG. 2A help improve linearity.

Figure 2A:
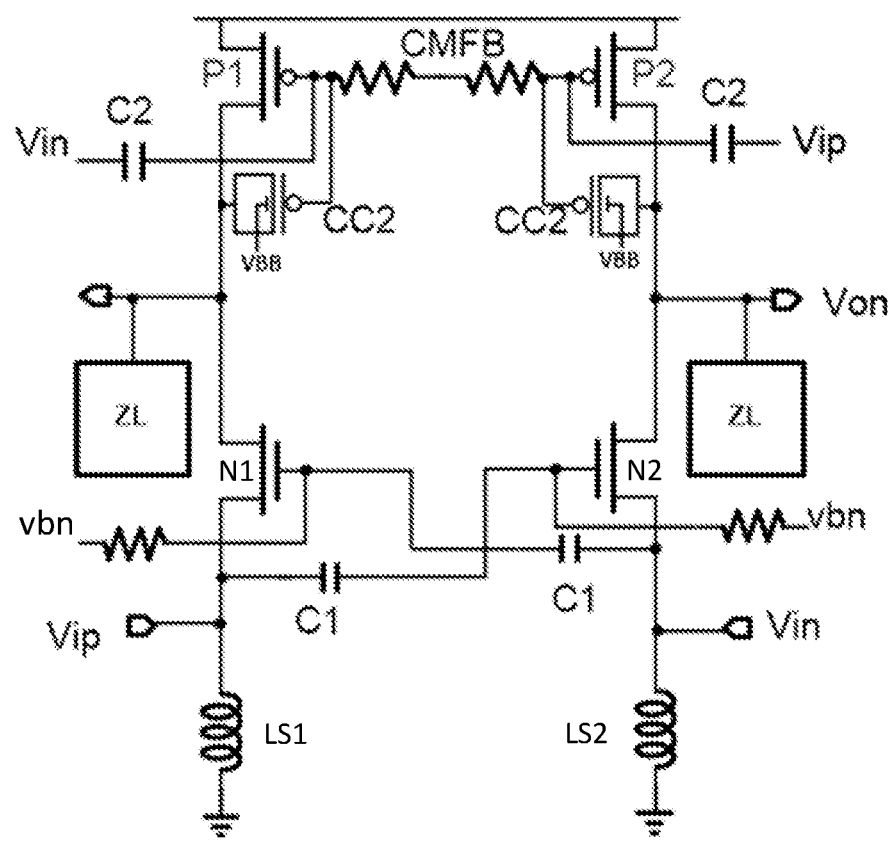
FIGS. 2A-2B are schematic diagrams illustrating a non-cross coupled amplifier with differential input according to embodiments herein.

FIG. 2A shows another example of an amplifier herein that is similar to the amplifier shown in FIG. 1A; however, in FIG. 2A, the variable capacitors CC2 are not cross-coupled but instead are aligned with one side of the amplifier circuit. Again, FIG. 2B shows the same device shown in FIG. 2A, but FIG. 2B also illustrates some of the current flows (which have the same labels in the drawings that are used above).

Figure 2B:
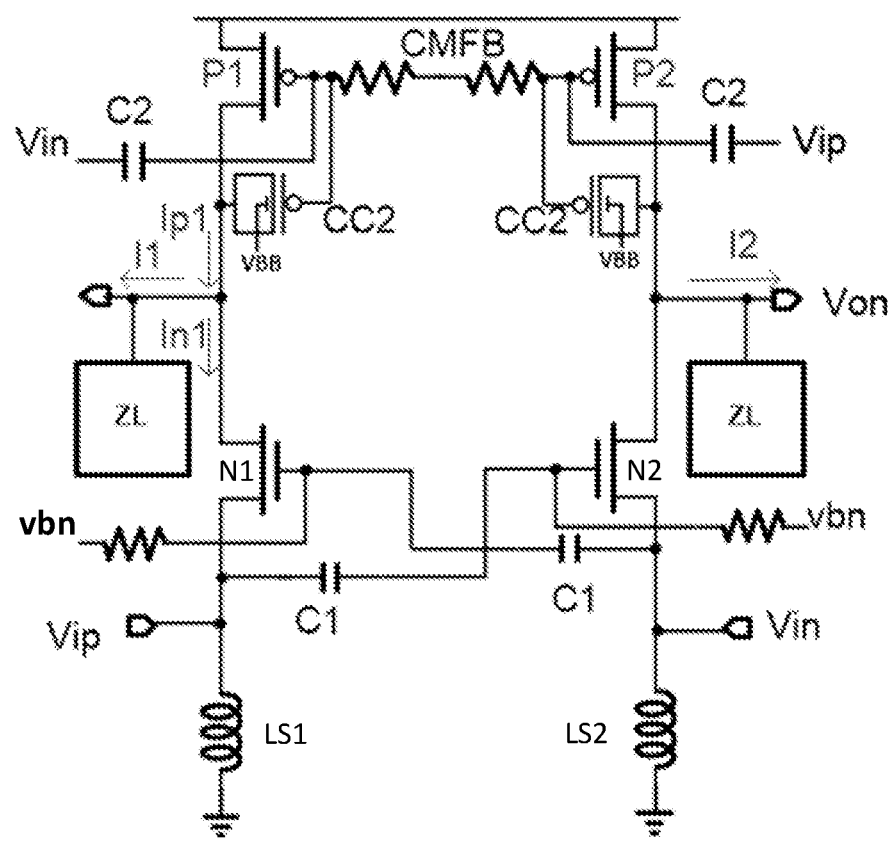

With this, as shown in FIG. 2B, the current flows are controlled differently relative to the flows shown in FIG. 1B. FIG. 2B shows that variable capacitors CC2 increase equivalent gate to drain capacitance (Cgd) of transistor P1 by adding capacitance. Gate to drain capacitance and capacitor C1 form a voltage divider for Vin. Increasing gate to drain capacitance effectively reduces the Vin coupled to the gate of transistor P1, and thus reduces |Ip1| and |I1|, again making current Io smaller and improving linearity. The capacitance of variable capacitor CC2 can similarly be adjusted through the back gate bias VBB.

Figure 3A:
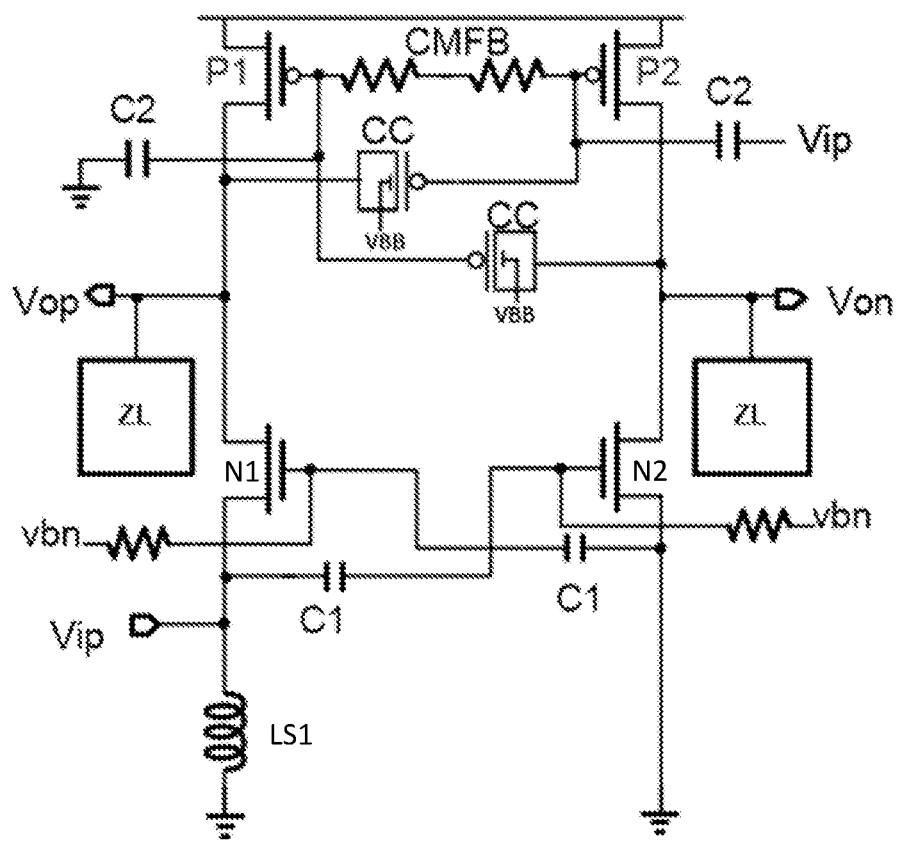
FIGS. 3A-3B are schematic diagrams illustrating a cross coupled amplifier with single-ended input according to embodiments herein.

FIG. 3A shows another example of an amplifier herein that is similar to the amplifier shown in FIG. 1A; however, in FIG. 3A, the amplifier only includes a single ended input Vip. The structure shown in FIG. 3A again includes cross-coupled adjustable capacitors CC. Again, FIG. 3B shows the same device shown in FIG. 3A, but FIG. 3B also illustrates some of the current flows.

Figure 3B:
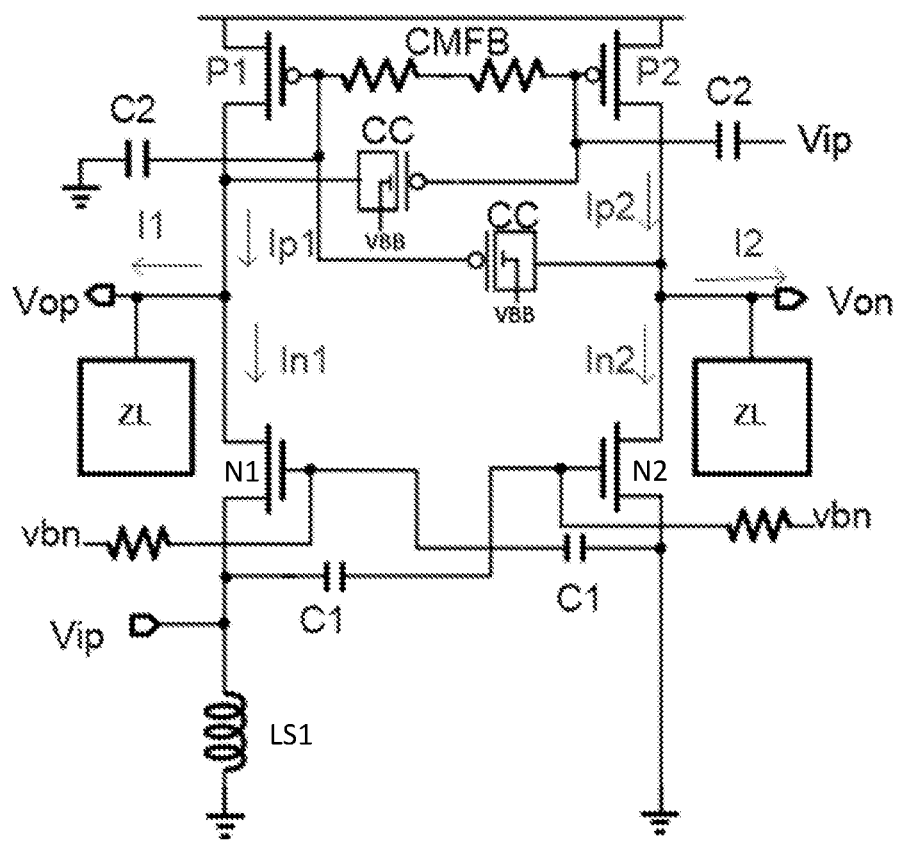

Because the input Vip is single-ended, the amplifier in FIGS. 3A, 3B is asymmetric. Hence the currents I1 and I2 are not necessarily out of phase. In this case, the gate of transistor P1 is bypassed to ground through capacitor C2. Ideally, transistor P1 will not contribute IM current Ip1. However, due to the gate to drain capacitance of transistor P1, Vop is coupled to the gate of transistor P1. Since Von has the opposite polarity with respect to Vop, the cross-coupled capacitor CC introduces the opposite IM current as to the one induced by Vop coupling. The generated compensating current amount can be adjusted through the voltage bias sources VBB applied to the back gate of variable capacitor CC to get current I1 in phase with current I2. Hence, the total IM current is |I1−I2|. This will potentially result in currents I1 and I2 canceling and improve linearity.

Figure 4A:
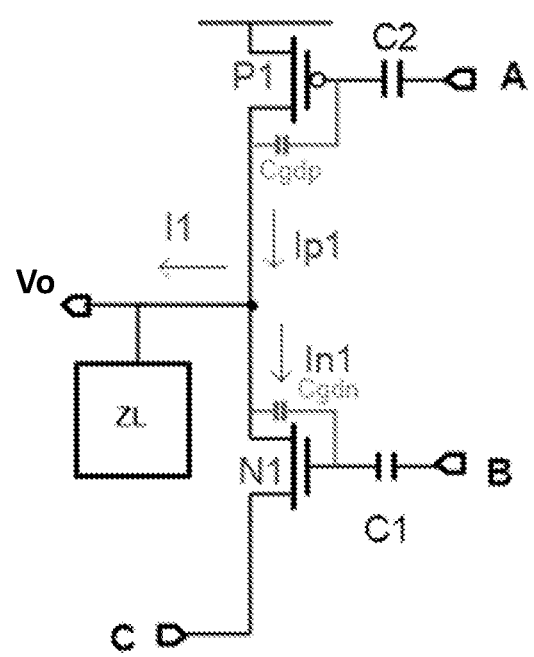
FIG. 4A-4B are schematic diagrams illustrating a conceptual amplifier with multiple inputs according to embodiments herein.

FIG. 4A is a conceptual example illustrating the general topology of one-half the amplifiers shown in FIGS. 1A-3B. Therefore, FIG. 4A illustrates one of the transistors P1, one of the transistors N1, one of the capacitors C1, and one of the capacitors C2 that are discussed in detail above. Additionally, while not representing a separate element, FIG. 4A also shows the drain to gate capacitance of the complementary device P1(Cgdp) and the drain to gate capacitance (Cgdn) of the first input device N1. The identification letters A, B, and C represents different possible input nodes that could be used, and Vo represents the output port.

Figure 4B:
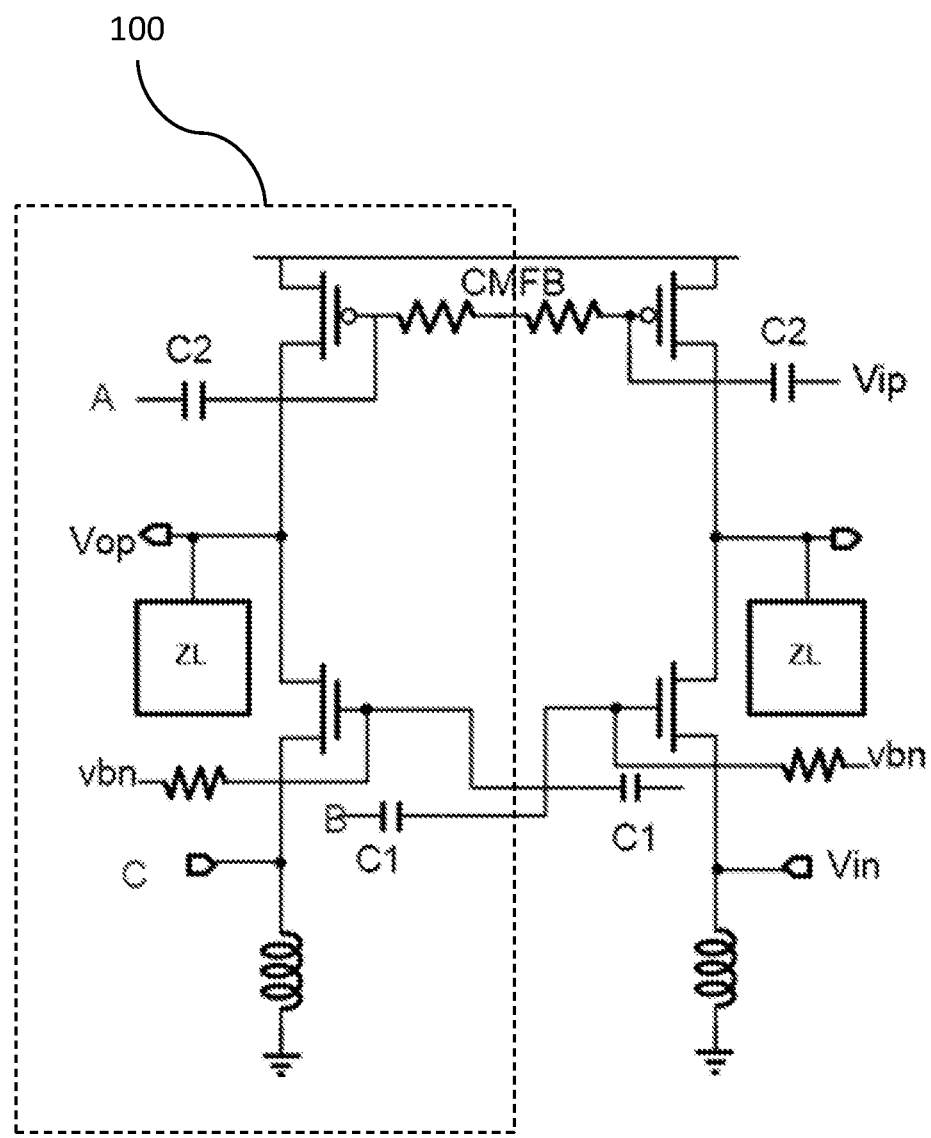

FIG. 4B shows the different possible input nodes A, B, and C in a half 100 of a circuit that is generic amplifier with respect to the amplifiers shown in FIGS. 1A-3B, but without any variable capacitors yet in place. The conceptual circuits shown in FIGS. 4A and 4B can be used to determine where the variable capacitors should be located. To design different amplifiers, the input can be coupled through any port among A, B and C. The input nodes A, B, and C that are not to be used in the amplifier are bypassed to ground. After the relative magnitude and phase between currents Ip1 and In1 are determined (e.g., from simulation) the adjustable capacitors can be placed properly (either in cross-coupled or non cross-coupled way) within the conceptual circuits shown in FIGS. 4A and 4B to reduce IM current and improve linearity.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures, in one example, can be formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements).

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An amplifier comprising:
   an input transistor pair connected to amplifier input nodes;
   a complementary transistor pair connected to a common bias, wherein amplifier output nodes are connected to the input transistor pair and the complementary transistor pair;
   variable capacitors connected between the complementary transistor pair and the amplifier output nodes; and
   a voltage bias connected to gates of the variable capacitors.

2. The amplifier according to claim 1, wherein the variable capacitors are cross-coupled between the amplifier output nodes.

3. The amplifier according to claim 1, wherein the voltage bias is connected to back gates of the variable capacitors.

4. The amplifier according to claim 1, wherein the variable capacitors comprise semiconductor structures with adjustable capacitance.

5. The amplifier according to claim 1, wherein the variable capacitors comprise transistor structures with connected sources and drains.

6. The amplifier according to claim 1, wherein transistors of the input transistor pair have an opposite polarity from the transistors of the complementary transistor pair.

7. An amplifier comprising:
   an input transistor pair, wherein sources of the input transistor pair are connected to amplifier input nodes;
   a complementary transistor pair, wherein gates of the complementary transistor pair are connected to a common bias, and wherein amplifier output nodes are connected to a drain of the input transistor pair and a source of the complementary transistor pair;
   first capacitors connected between the gates of the input transistor pair and the amplifier input nodes;
   second capacitors connected between the gates of the complementary transistor pair and the amplifier input nodes; and
   variable capacitors connected between the gates of the complementary transistor pair and the amplifier output nodes.

8. The amplifier according to claim 7, wherein the variable capacitors are cross-coupled between the amplifier output nodes.

9. The amplifier according to claim 7, further comprising a voltage bias connected to the variable capacitors.

10. The amplifier according to claim 9, wherein the voltage bias is connected to back gates of the variable capacitors.

11. The amplifier according to claim 7, wherein the variable capacitors comprise semiconductor structures with adjustable capacitance.

12. The amplifier according to claim 7, wherein the variable capacitors comprise transistor structures with connected sources and drains and bodies connected to a bias voltage source.

13. The amplifier according to claim 7, wherein transistors of the input transistor pair have an opposite polarity from the transistors of the complementary transistor pair.

14. An amplifier comprising:
   an input transistor pair, wherein sources of the input transistor pair are connected to amplifier input nodes;
   a complementary transistor pair, wherein gates of the complementary transistor pair are connected to a common bias, and wherein amplifier output nodes are connected to a drain of the input transistor pair and a source of the complementary transistor pair;
   first capacitors connected between the gates of the input transistor pair and the amplifier input nodes;
   second capacitors connected between the gates of the complementary transistor pair and the amplifier input nodes;
   variable capacitors connected between the gates of the complementary transistor pair and the amplifier output nodes; and
   voltage bias sources connected to the variable capacitors,
   wherein the variable capacitors comprise metal oxide semiconductor (MOS) transistors having back gates connected to the voltage bias sources.

15. The amplifier according to claim 14, wherein the variable capacitors are cross-coupled between the amplifier output nodes.

16. The amplifier according to claim 14, wherein the MOS transistors of the variable capacitors have gates connected between the gates of the complementary transistor pair and the common bias.

17. The amplifier according to claim 14 wherein the MOS transistors of the variable capacitors have sources and drains connected to the amplifier output nodes.

18. The amplifier according to claim 14, wherein capacitances of the variable capacitors are controlled by the voltage bias sources.

19. The amplifier according to claim 14, wherein transistors of the input transistor pair have an opposite polarity from the transistors of the complementary transistor pair.

* * * * *